(12) United States Patent
Shin et al.

(10) Patent No.: US 11,990,533 B2
(45) Date of Patent: May 21, 2024

(54) TUNNELING FIELD EFFECT TRANSISTOR AND SEMICONDUCTOR DEVICE INCLUDING THE SAME

(71) Applicant: KOREA ADVANCED INSTITUTE OF SCIENCE AND TECHNOLOGY, Daejeon (KR)

(72) Inventors: MinCheol Shin, Daejeon (KR); YeongJun Lim, Daejeon (KR); Junbeom Seo, Daejeon (KR)

(73) Assignee: Korea Advanced Institute Of Science And Technology, Daejeon (KR)

( * ) Notice: Subject to any disclaimer, the term of this patent is extended or adjusted under 35 U.S.C. 154(b) by 269 days.

(21) Appl. No.: 17/701,195

(22) Filed: Mar. 22, 2022

(65) Prior Publication Data

US 2022/0310828 A1    Sep. 29, 2022

(30) Foreign Application Priority Data

Mar. 23, 2021   (KR) .................. 10-2021-0037091

(51) Int. Cl.
*H01L 29/73*   (2006.01)
*H01L 29/739*  (2006.01)

(52) U.S. Cl.
CPC ...... *H01L 29/7311* (2013.01); *H01L 29/7391* (2013.01)

(58) Field of Classification Search
CPC ... H01L 29/7311; H01L 29/267; H01L 29/78; H01L 29/0895; H01L 29/6693; H01L 29/7376
See application file for complete search history.

(56) References Cited

U.S. PATENT DOCUMENTS

2020/0006542 A1*  1/2020  Vasen .................. H01L 29/0676
2020/0373404 A1* 11/2020  Lin ..................... H01L 29/4966

FOREIGN PATENT DOCUMENTS

| KR | 10-2011-0089884 A | 8/2011 |
| KR | 10-2014-0107345 A | 9/2014 |
| KR | 10-2016-0010217 A | 1/2016 |
| KR | 10-2189055 B1     | 12/2020 |

* cited by examiner

*Primary Examiner* — Wasiul Haider
(74) *Attorney, Agent, or Firm* — Womble Bond Dickinson (US) LLP (57) ABSTRACT

A TEFT includes a drain region on a substrate, a channel on the drain region, a dipole formation layer (DFL) on the channel, a dipole formation layer (DFL) on the channel, a source region on the DFL, a gate insulation pattern surrounding the channel, and a gate electrode surrounding the gate insulation pattern. The DFL contacts the channel and the source region and form dipoles between the channel and the source region.

20 Claims, 12 Drawing Sheets

TUNNELING FIELD EFFECT TRANSISTOR AND SEMICONDUCTOR DEVICE INCLUDING THE SAME

CROSS-REFERENCE TO RELATED APPLICATION

This application claims priority to and benefits of Korean Patent Application No. 10-2021-0037091 under 35 U.S.C. § 119 filed on Mar. 23, 2021 in the Korean Intellectual Property Office, the entire contents of which are incorporated herein by reference.

BACKGROUND

1. Technical Field

Embodiments relate to a tunneling effect transistor and a semiconductor device including the same.

2. Description of the Related Art

As the size of a transistor decreases, a supply voltage decreases so that the threshold voltage of the transistor has to decrease. However, in a metal oxide semiconductor field effect transistor (MOSFET) that may be operated by thermionic emission, the sub-threshold swing (SS) may not have a low value, e.g., of less than about 60 mV/dec, and thus the MOSFET may not be operated at a low threshold voltage.

Recently, a tunneling field effect transistor (TFET) that may be operated by band-to-band tunneling has been studied, however, if the tunnel barrier between a source region and a channel region is high, the on-current may also be too low.

SUMMARY

One object of the invention is to provide a TFET having enhanced electrical characteristics.

Another object of the invention is to provide a semiconductor device including a TFET having enhanced electrical characteristics.

According to an embodiment of the invention, there is provided a tunneling field effect transistor (TFET). The TEFT may include a drain region on a substrate, a channel on the drain region, a dipole formation layer (DFL) on the channel, a dipole formation layer (DFL) on the channel, a source region on the DFL, a gate insulation pattern surrounding the channel, and a gate electrode surrounding the gate insulation pattern. The DFL may contact the channel and the source region and form dipoles between the channel and the source region.

In an example embodiment, the DFL may include a III-V group compound or a II-VI group compound.

In an example embodiment, the DFL may include gallium arsenide (GaAs), indium arsenide (InAs), gallium antimonide (GaSb) or indium antimonide (InSb).

In an example embodiment, the DFL may include a bilayer or a plurality of bilayers. The bilayer may include a III group material layer and a V group material layer, or a II group material layer and a VI group material layer.

In an example embodiment, the channel, the drain region and the source region may include a IV group material, and the drain region and the source region may be doped with n-type impurities and p-type impurities, respectively.

In an example embodiment, the channel may be undoped, or doped with n-type impurities with a doping concentration less than that of the drain region.

In an example embodiment, the channel may include silicon, and an upper surface of the channel contacting the DFL may have (001) crystal plane, (111) crystal plane, or (311) crystal plane.

In an example embodiment, the DFL may at least partially overlap the gate electrode in a horizontal direction substantially parallel to an upper surface of the substrate.

In an example embodiment, a portion of the DFL overlapped by the gate electrode may be covered by the gate insulation pattern.

According to an embodiment of the invention, there is provided a tunneling field effect transistor (TFET). The TEFT may include a source region including a IV group material doped with p-type impurities on a substrate, a drain region being spaced apart from the source region in a horizontal direction substantially parallel to an upper surface of the substrate and including the IV group material doped with n-type impurities on the substrate, a channel including the IV group material between the source region and the drain region, the channel, a DFL between and contacting the source region and the channel and including a III-V group compound or a II-VI group compound, and a gate electrode overlapping the channel and at least a portion of the DFL in a vertical direction substantially perpendicular to the upper surface of the substrate. The DFL may form dipoles between the channel and the source region.

In an example embodiment, the DFL may include gallium arsenide (GaAs), indium arsenide (InAs), gallium antimonide (GaSb) or indium antimonide (InSb).

In an example embodiment, the DFL may include a bilayer or a plurality of bilayers. the bilayer may include a III group material layer and a V group material layer, or a II group material layer and a VI group material layer.

In an example embodiment, the channel may be undoped, or doped with n-type impurities at a doping concentration less than that of the drain region.

In an example embodiment, the channel may include silicon, and an upper surface of the channel contacting the DFL may have (001) crystal plane, (111) crystal plane, or (311) crystal plane.

In an example embodiment, the TFET may further comprise a gate insulation pattern between the channel and the gate electrode.

In an example embodiment, a portion of the DFL overlapped by the gate electrode may be covered by the gate insulation pattern.

In an example embodiment, the gate electrode may be disposed on the channel.

In an example embodiment, the gate electrode may be a first gate electrode, and the TFET may further comprise a second gate electrode under the channel.

According to an embodiment of the invention, there is provided a semiconductor device. The semiconductor device may include a drain region including silicon doped with n-type impurities on a substrate, a channel including undoped silicon or silicon doped with n-type impurities with a doping concentration less than that of the drain region on the drain region, a DFL including a III-V group compound or a II-VI group compound on the channel, a source region including silicon doped with p-type impurities on the DFL, a gate insulation pattern surrounding the channel, a gate electrode surrounding the gate insulation pattern, a first contact plug electrically connected to the source region, and a second contact plug electrically connected to the drain region. The DFL may contact the channel and the source region and forms dipoles between the channel and the source region.

In an example embodiment, a lower surface of the DFL may be lower than an upper surface of the gate electrode.

The TFET in accordance with example embodiments may have a relatively high on-current and a relatively high on-off ratio, and a relatively low SS and a relatively low operation voltage when compared to a homo-junction TFET. Additionally, the TFET may be easily manufactured by using silicon process unlike a hetero-junction TFET.

DETAILED DESCRIPTION OF THE EMBODIMENTS

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, an embodiment will be explained as an example. Like reference numerals refer to like elements, and repeated explains thereon are omitted herein.

Figure 1:
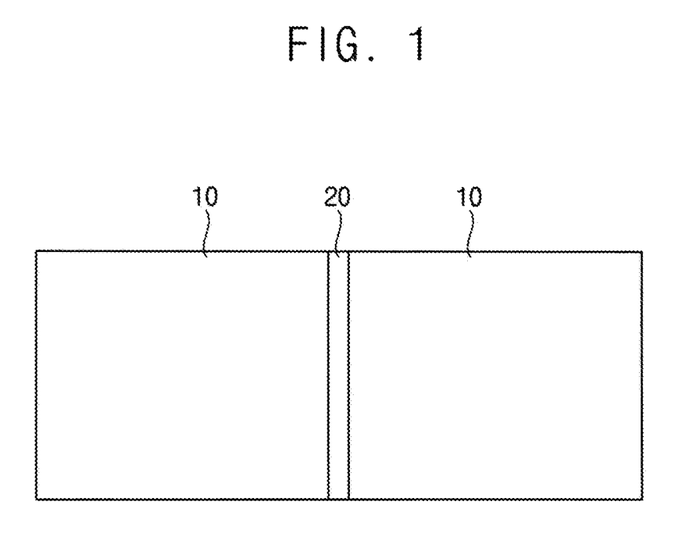
FIG. 1 is a cross-sectional view illustrating a dipole formation layer used in a TFET in accordance with example embodiments.
Figure 2:
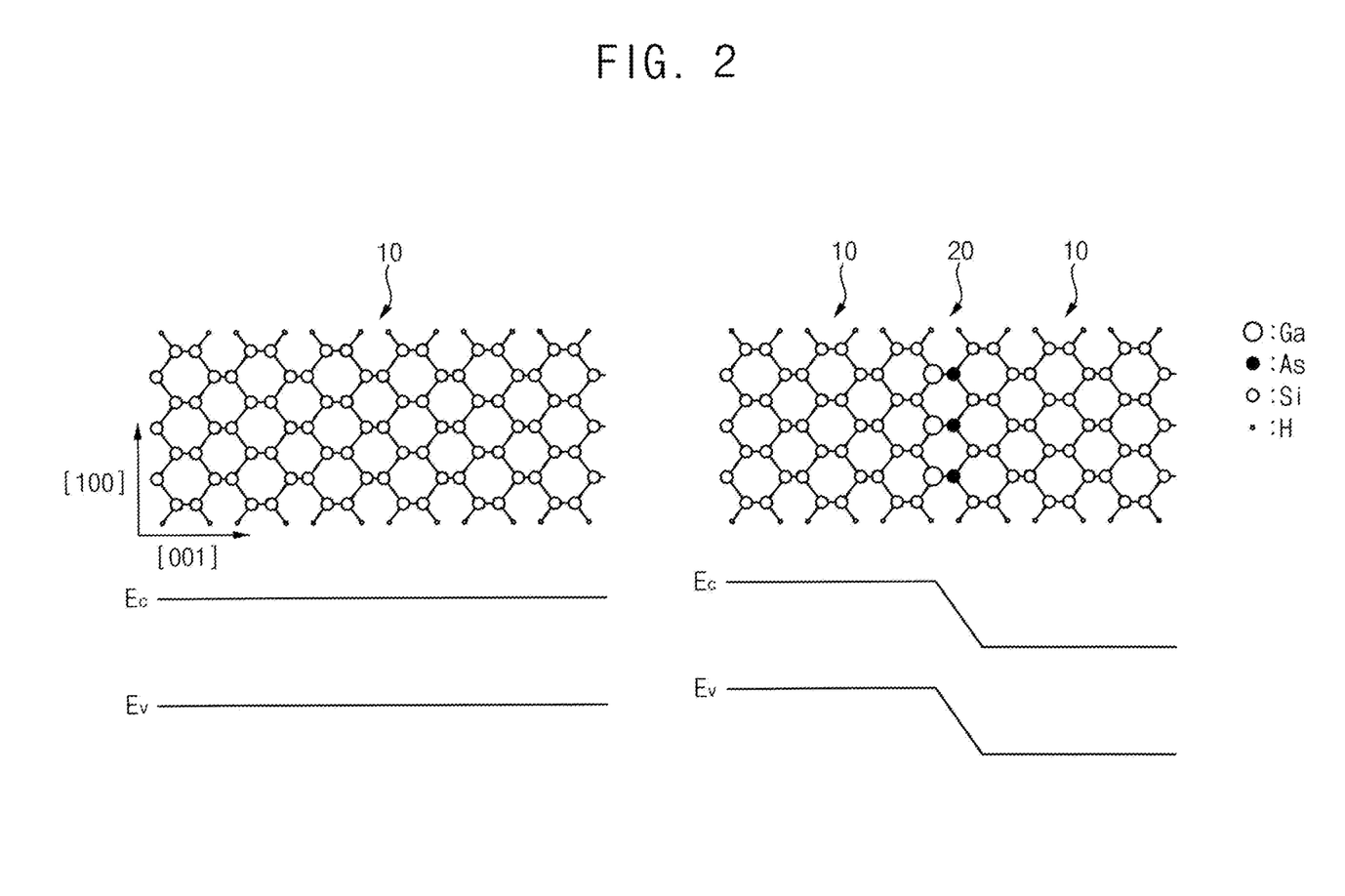
FIGS. 2 and 3 illustrate that energy band structure and electrostatic potential change of a single material layer changes by the dipole formation layer.
Figure 3:
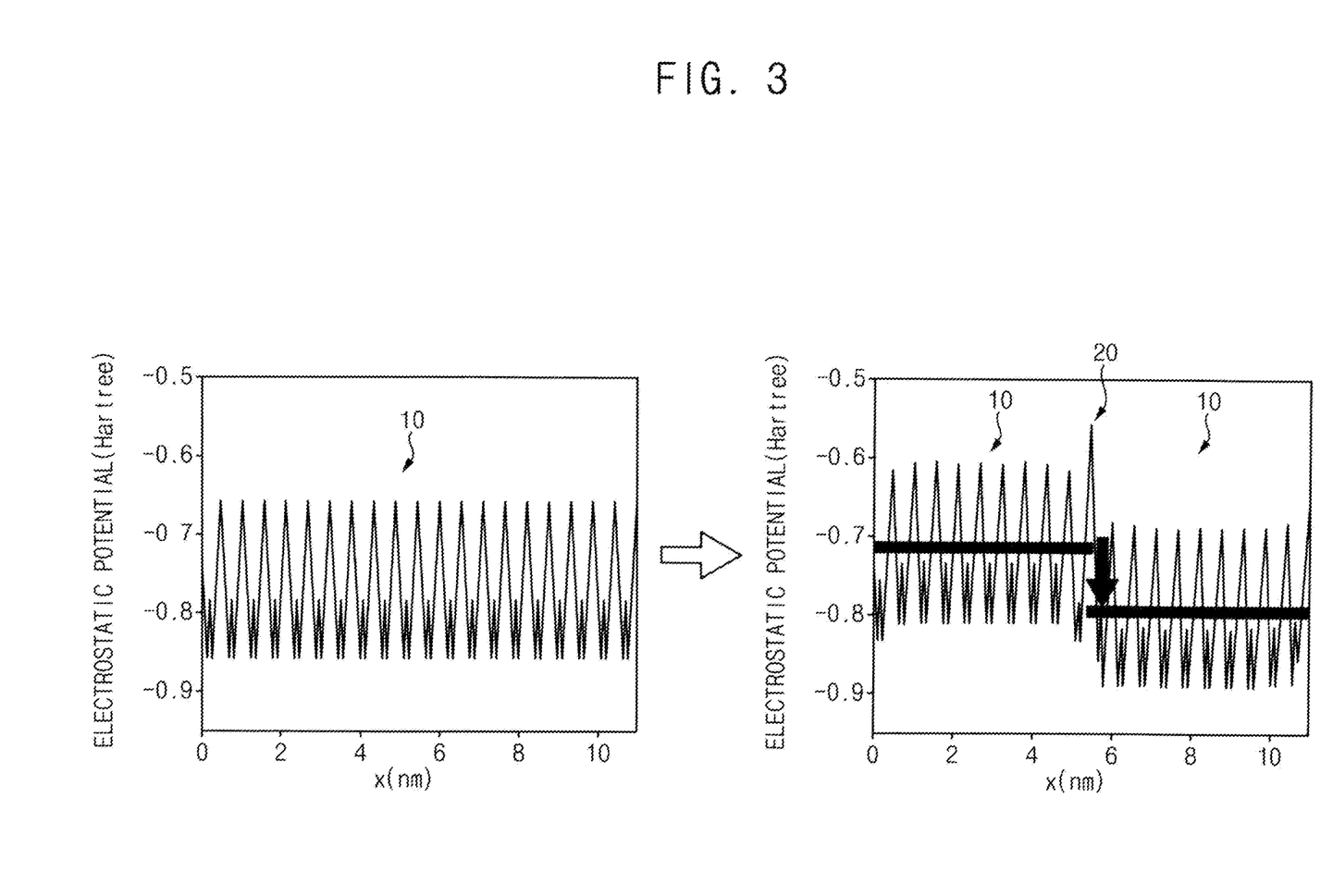

FIG. 1 is a cross-sectional view illustrating a dipole formation layer used in a TFET in accordance with example embodiments, and FIGS. 2 and 3 illustrate that energy band structure and electrostatic potential change of a single material layer changes by the dipole formation layer.

Referring to FIG. 1, a dipole formation layer (DFL) 20 may be inserted into a single material layer 10 serving as, e.g., a source region, a channel or a drain region. The DFL 20 may also be referred to as dipole modulation layer (DML).

In example embodiments, the single material layer 10 may include a IV group material, e.g., silicon, germanium, etc.

In example embodiments, the DFL 20 may include a material having a lattice structure similar to that of a material of the single material layer 10 and having polarity. Thus, the DFL 20 may include a III-V group compound or a II-VI group compound. For example, the DFL 20 may include gallium arsenide (GaAs), indium arsenide (InAs), gallium antimonide (GaSb), indium antimonide (InSb), etc.

Referring to FIG. 2, the DFL 20 is inserted into the single material layer 10, so that the energy band structure of the single material layer 10 may be changed.

In the drawing, the single material layer 10 includes undoped silicon, and the DFL 20 includes gallium arsenide (GaAs).

As illustrated above, each of valence band Ev and conduction band Ec of the single material layer 10 having no DFL 20 therein may have a constant energy level. However, as the DFL 20 is inserted into the single material layer 10, for example, valence band Ev and conduction band Ec of a right part of the single material layer 10 may have energy levels lower than valence band Ev and conduction band Ec, respectively, of a left part of the single material layer 10.

FIG. 2 shows that the DFL 20 is inserted between (001) crystal planes of the single material layer 10, however, the inventive concept may not be limited thereto. For example, if the single material layer 10 includes silicon and the DFL 20 includes gallium arsenide (GaAs), the DFL 20 may be inserted between any crystal planes in which a direction of arrangement of gallium atoms and arsenic atoms (a horizontal direction in the drawing) is the same as a direction of a dipole. For example, the DFL layer 20 may be inserted between (111) crystal planes or (311) crystal planes of the single material layer 10.

FIG. 3 shows that an electrostatic potential of the single material layer 10 changes according as the DFL 20 is inserted into the single material layer 10.

Referring to FIG. 3, an electrostatic potential of a part of the single material layer 10 at a right side of the DFL 20 is lower than that of a part of the single material layer 10 at a left side of the DFL 20.

Figure 4:
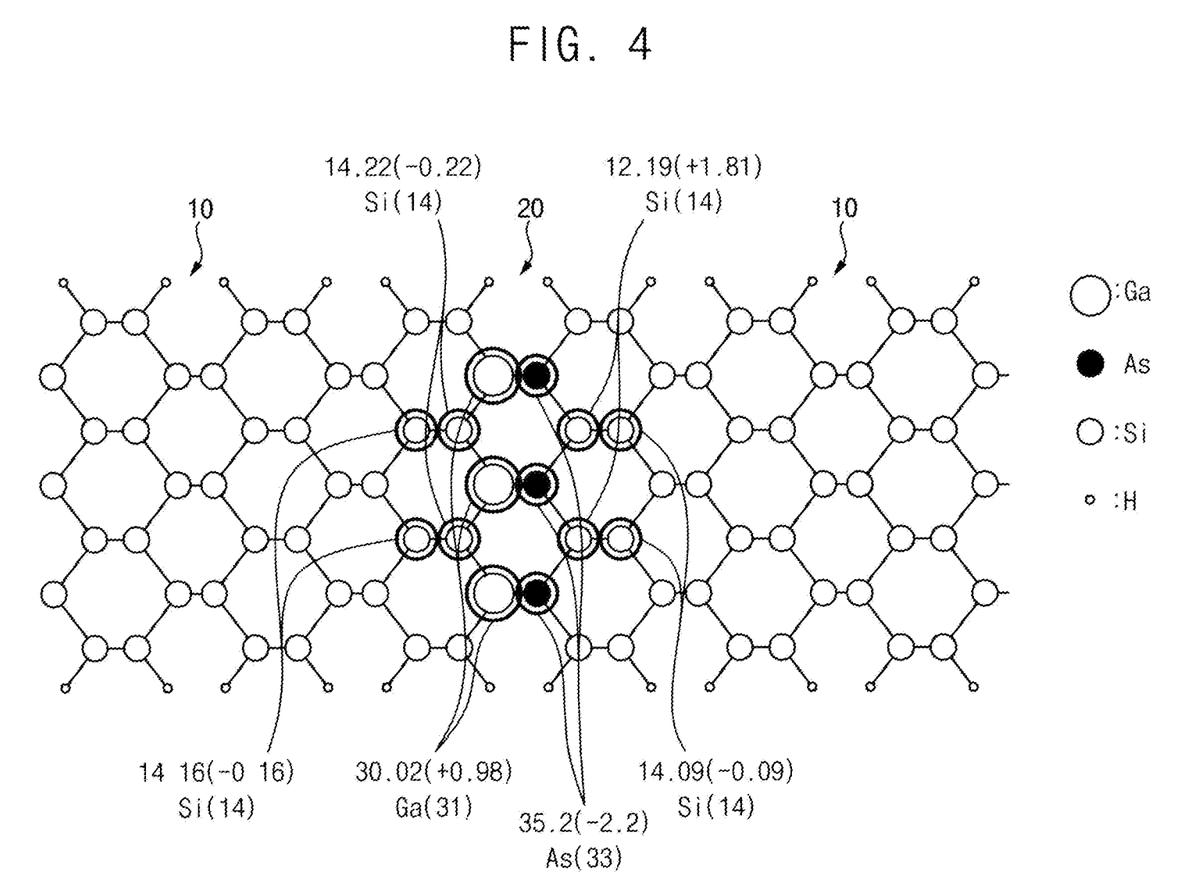
FIG. 4 shows the relative change of a charge amount of each atom when the DFL including gallium arsenide is inserted into the single material layer including silicon.
Figure 5:
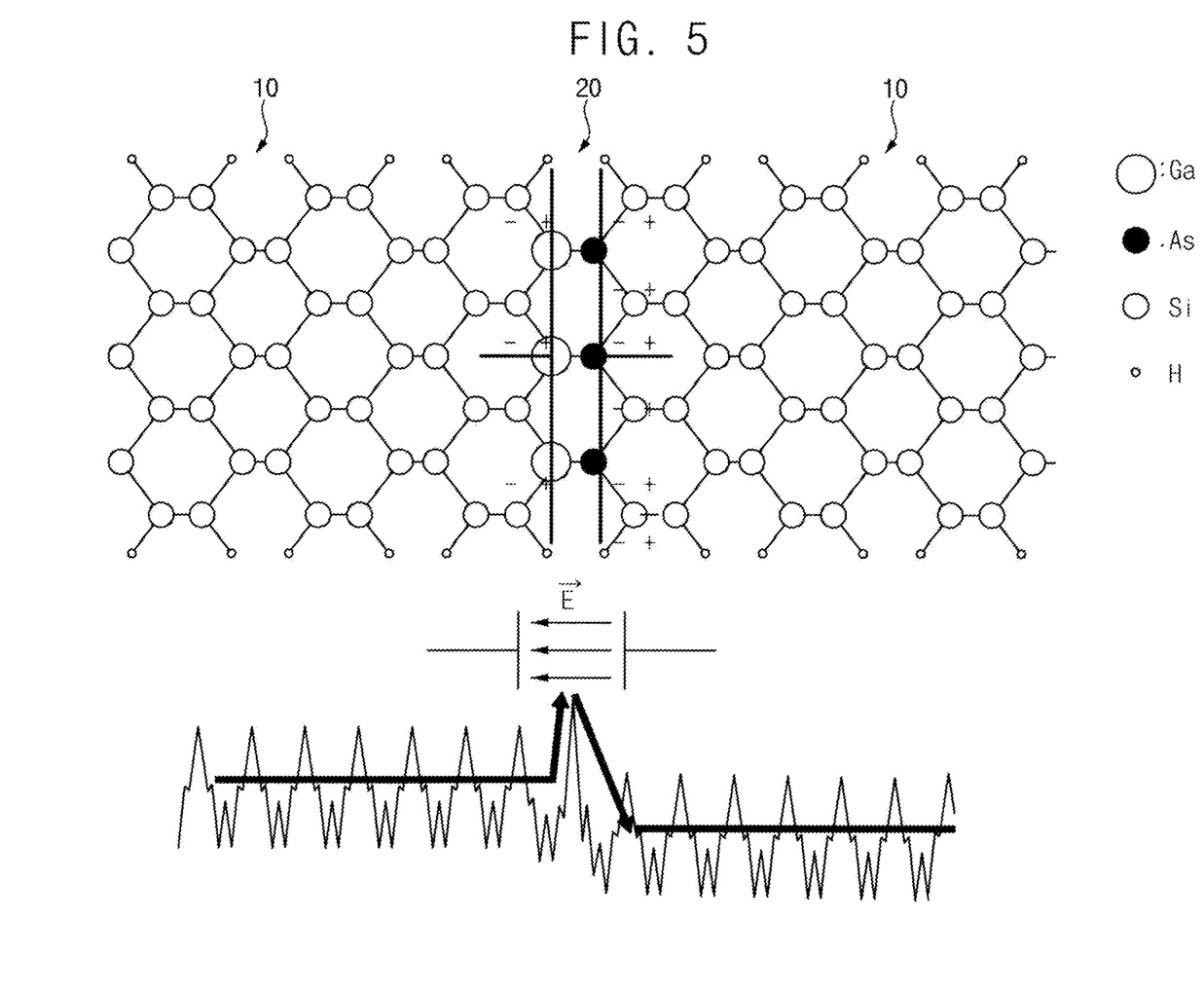
FIG. 5 shows an electrostatic field generated by the dipoles between the DFL 20 and the single material layer 10, and a potential drop in the single material layer by the electric field.
Figure 6:
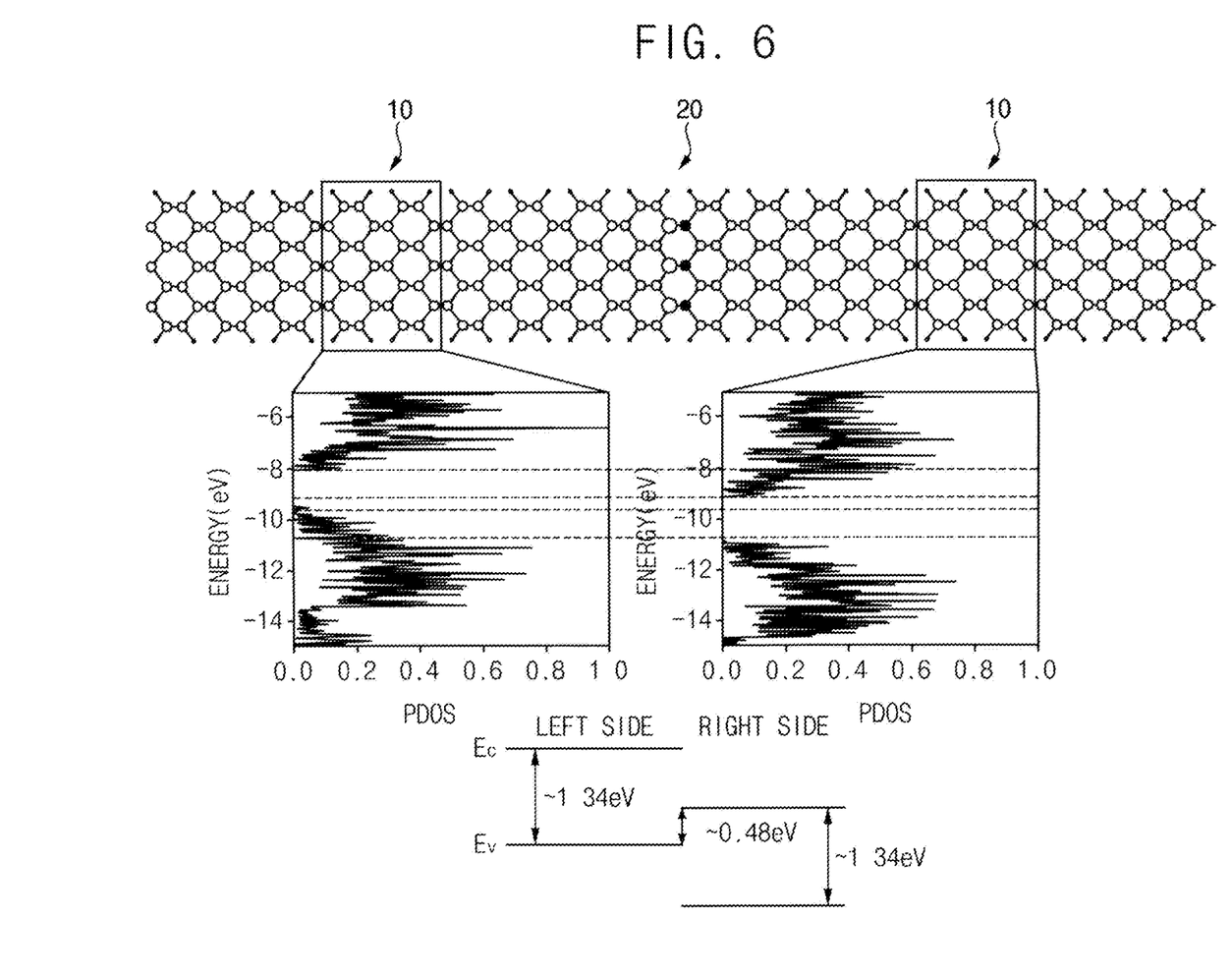
FIG. 6 shows the estimation result of the projected density of states (PDOS) of the single material layer having the DFL therein.

FIGS. 4 to 6 illustrate that electrostatic potentials and energy band structures of respective parts of the single material layer that are disposed at opposite sides of the DFL changes according as dipoles are generated due to the DFL inserted into the single material layer.

FIG. 4 shows the relative change of a charge amount of each atom when the DFL 20 including gallium arsenide is inserted into the single material layer 10 including silicon.

Referring to FIG. 4, a first silicon atom closest to a gallium atom has a negative charge amount of 0.22, a second silicon atom near to the first silicon atom has a negative charge amount of 0.16, and the gallium atom has a positive charge amount of 0.98.

Additionally, a third silicon atom closest to an arsenic atom has a positive charge amount of 1.81, a fourth silicon atom near to the third silicon atom has a negative charge amount of 0.09, and the arsenic atom has a negative charge amount of 2.2.

That is, electrical charges move between III group atoms included in the DFL 20 and silicon atoms, that is, between gallium atoms and silicon atoms, and between V group atoms included in the DFL 20 and silicon atoms, that is, between arsenic atoms and silicon atoms, so that dipoles of the horizontal direction in the drawing may be generated.

FIG. 5 shows an electrostatic field generated by the dipoles between the DFL 20 and the single material layer 10, and a potential drop in the single material layer 10 by the electric field.

Referring to FIG. 5, the dipoles between the DFL 20 and the single material layer 10 may form a capacitor, and the electrostatic field of the capacitor may generate an electrostatic potential difference between respective parts of the single material layer 10 at opposite sides of the DFL 20.

That is, an electrostatic potential of the part of the single material layer 10 at a right side of the DFL 20 may be dropped by the electrostatic field, so as to be lower than that of the part of the single material layer 10 at a left side of the DFL 20.

However, an electrostatic potential of a part of the single material layer 10 that is disposed at a right side or a left side of the DFL 20 but not close thereto may be constant.

FIG. 6 shows the estimation result of the projected density of states (PDOS) of the single material layer 10 having the DFL 20 therein.

Referring to FIG. 6, band gaps of the respective parts of the single material layer 10 at opposite sides of the DFL 20 are kept at 1.34 eV, however, the energy band level of the part of the single material layer 10 at the right side of the DFL 20 is lowered by about 0.86 eV when compared to that of the part of the single material layer 10 at the left side of the DFL 20.

Thus, when the single material layer 10 having the DFL 20 inserted therein serves as a source region, a channel and/or a drain region, a TFET including the single material layer 10 may have characteristics of a homo-junction TFET rather than a hetero-junction TFET.

Figure 7:
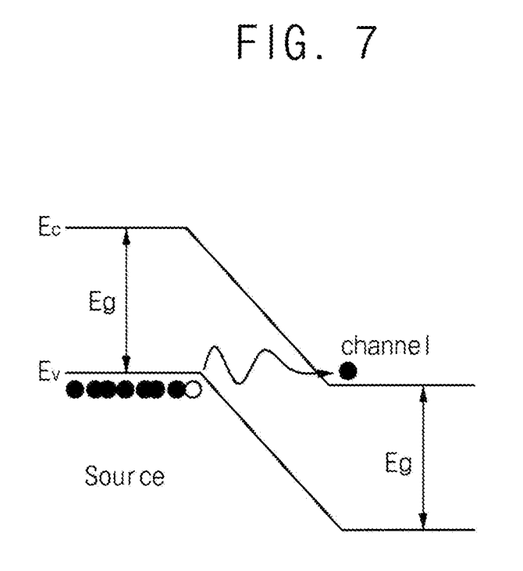
FIGS. 7 and 8 illustrate energy band structures and tunneling of carriers in a homo-junction TFET and a hetero-junction TFET, respectively.
Figure 8:
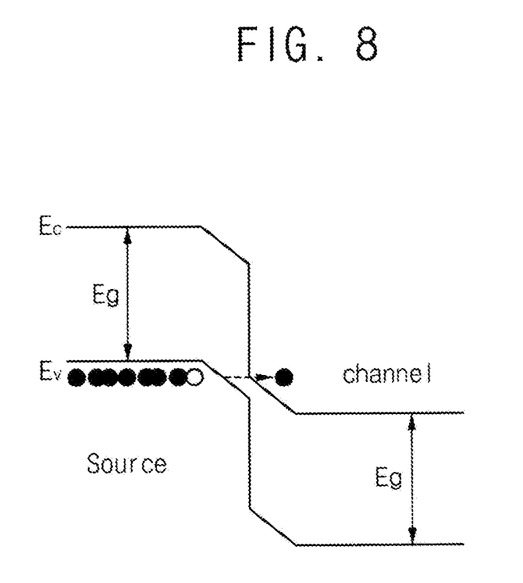

FIGS. 7 and 8 illustrate energy band structures and tunneling of carriers in a homo-junction TFET and a hetero-junction TFET, respectively.

Referring to FIG. 7, in the homo-junction TFET, the energy barrier may have a value similar to that of the energy band gap Eg of a material of a source region and a channel. Thus, carriers may not easily pass through the high energy barrier by tunneling, so that the homo-junction TFET may have a low on-current.

Referring to FIG. 8, in the homo-junction TFET, the energy barrier may depend not only on the energy band gaps Eg of the materials of the source region and the channel, but also on the energy level difference of the conduction bands of the source region and the channel. Thus, carriers may easily pass through the low energy barrier by tunneling, so that the hetero-junction TFET may have a high on-current.

In example embodiments, the DFL 20 may be inserted into the single material layer 10, and the band gaps of the respective parts of the single material layer 10 at the opposite sides of the DFL 20 may be the same, while the energy levels thereof may be different. Thus, when the single material layer 10 serves as a source region and a channel of a TFET and the DFL 20 is formed between the source region and the channel, the TFET may have a high on-current like the hetero-junction TFET illustrated with reference to FIG. 8.

Figure 9:
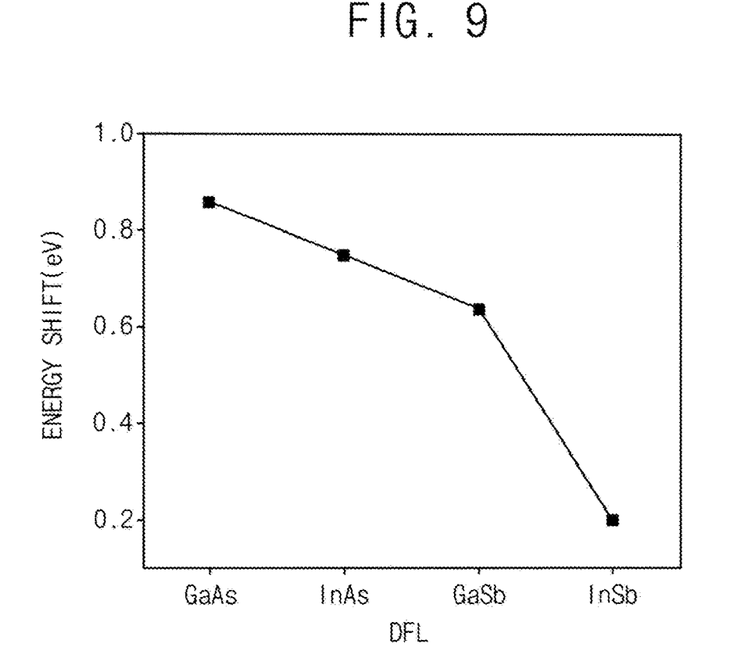
FIG. 9 is a graph illustrating the energy level shift between the respective parts of the single material layer at opposite sides of the DFL according to the material of the DFL.

FIG. 9 is a graph illustrating the energy level shift between the respective parts of the single material layer 10 at opposite sides of the DFL 20 according to the material of the DFL 20.

Referring to FIG. 9, the energy level shift is equal to or more than about 0.8 eV when the DFL 20 includes gallium arsenide (GaAs), while the energy level shift is about 0.2 eV when the DFL 20 includes indium antimonide (InSb).

Thus, the source region and the channel may have desired energy level shift by adjusting the material of the DFL 20, that is, the kind of III-V group compounds or II-VI group compounds.

Figure 10:
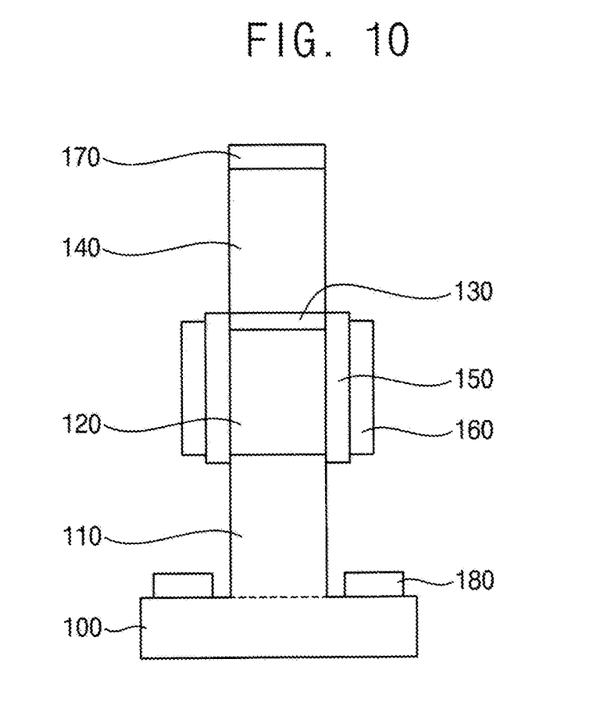
Figure 11:
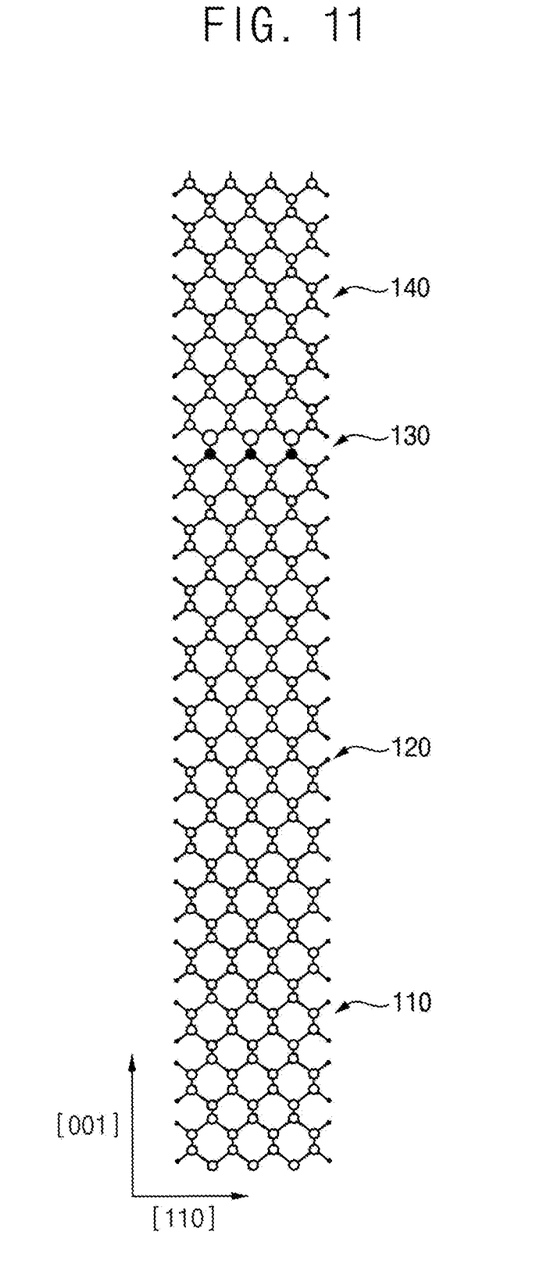
Figure 12:
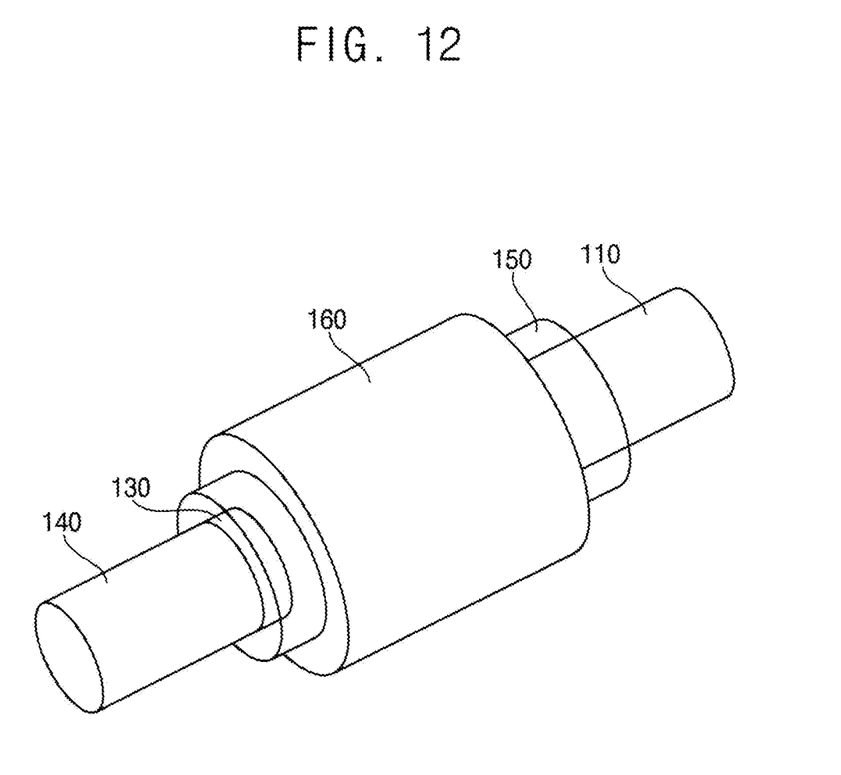

FIGS. 10 and 12 are a cross-sectional view and a perspective view, respectively, illustrating a TFET in accordance with example embodiments, and FIG. 11 illustrates the lattice structure of a drain region, a channel, a DFL and a source region of the TFET.

Referring to FIGS. 10 to 12, the TFET may include a drain region 110, a channel 120, a DFL 130 and a source region 140 sequentially stacked on a substrate 100 in a vertical direction substantially perpendicular to and an upper surface of the substrate 100. Additionally, the TFET may include a gate insulation pattern 150 surrounding the channel 120 and a gate electrode 160 surrounding the gate insulation pattern 150. Thus, the TFET may be a vertical TFET including the channel 120 having a vertical direction.

Furthermore, the TFET may include a source contact plug 170 electrically connected to the source region 140, and a drain contact plug 180 electrically connected to the drain region 110.

The substrate 100 may include a IV group material, e.g., silicon, germanium, silicon-germanium, etc. Alternatively, the substrate 100 may include a III-V group compound such as GaP, GaAs, GaSb, etc. In an example embodiment, the substrate 100 may be a silicon-on-insulator (SOI) substrate or a germanium-on-insulator (GOI) substrate.

The drain region 110 may include single crystalline silicon or polysilicon highly doped with n-type impurities, e.g., phosphorous, arsenic, etc.

The channel 120 may include undoped single crystalline silicon or polysilicon. Alternatively, the channel 120 may include single crystalline silicon or polysilicon lightly doped with n-type impurities, e.g., phosphorous, arsenic, etc.

The source region 140 may include single crystalline silicon or polysilicon highly doped with p-type impurities, e.g., boron, aluminum, etc.

The DFL 130 may include a material having a lattice structure similar to that of a material included in the channel 120 and the source region 140 and having polarity in the vertical direction. Thus, the DFL 130 may include a III-V group compound or a II-VI group compound, e.g., gallium arsenide (GaAs), indium arsenide (InAs), gallium antimonide (GaSb), indium antimonide (InSb), etc.

In example embodiments, the DFL 130 may be formed between and contact the channel 120 and the source region 140, and dipoles in the vertical direction may be formed in the DFL 130 according to the arrangement of the atoms therein. For example, the DFL 130 may be formed between an upper surface of the channel 120 having (001) crystal plane, (111) crystal plane or (311) crystal plane, and a lower surface of the source region 140. In the DFL 130, a V group element and a III group element, or a VI group element and a II group element may be arranged in the vertical direction to form a dipole in the vertical direction.

In example embodiments, the DFL 130 may include a bilayer that may include a V group material layer (or a VI group material layer) at a first level and a III group material layer (or a II group material layer) at a second level. The V group material layer (or the VI group material layer) and the III group material layer (or the II group material layer) may be formed by, e.g., an atomic layer deposition (ALD) process.

In example embodiments, the DFL 130 may a bilayer or a plurality of bilayers sequentially stacked in the vertical direction. Even if the DFL 130 includes the plurality of bilayers, the DFL 130 may have a thickness much less than that of the channel 120 or the source region 140. As the DFL 130 is formed, the TFET in accordance with example embodiments may have a high on-current as the heterojunction TFET.

In the TFET in accordance with example embodiments, the source region 140 and the channel 120 may include the same material (e.g., silicon), and thus may be easily manufactured when compared to the fabrication of the heterojunction TFET in which different materials are bonded with each other.

The gate insulation pattern 150 may surround the channel 120, and partially or entirely surround the DFL 130 as well to cover the DFL 130. Alternatively, the gate insulation pattern 150 may cover only the channel 120, and may not cover the DFL 130. The gate insulation pattern 150 may include an oxide, e.g., silicon oxide.

The gate electrode 160 may overlap the channel 120 in a horizontal direction substantially parallel to the upper surface of the substrate 100. In example embodiments, the gate electrode 160 may at least partially overlap the DFL 130 in the horizontal direction. Thus, an upper surface of the gate electrode 160 may be substantially coplanar with or higher than a lower surface of the DFL 130. The upper surface of the gate electrode 160 may be substantially coplanar with or lower than an upper surface of the DFL 130. The gate electrode 160 may include, e.g., a metal, a metal nitride, a metal silicide and/or doped polysilicon.

The source contact plug 170 may be formed on the source region 140, and may transfer electrical signal applied by an outer wiring to the source region 140.

The drain contact plug 180 may be formed on the substrate 100 electrically connected to the drain region 110, and may transfer electrical signal applied by an outer wiring to the drain region 180. Alternatively, the drain contact plug 180 may directly contact the drain region 110.

Example embodiments may be applied to the vertical TFET, however, the inventive concept may not be limited thereto. As shown in FIG. 12, the drain region 110, the channel 120, the DFL 130 and the source region 140 included in the TFET may not be necessarily stacked in the vertical direction, but may be stacked in the horizontal direction.

Figure 13:
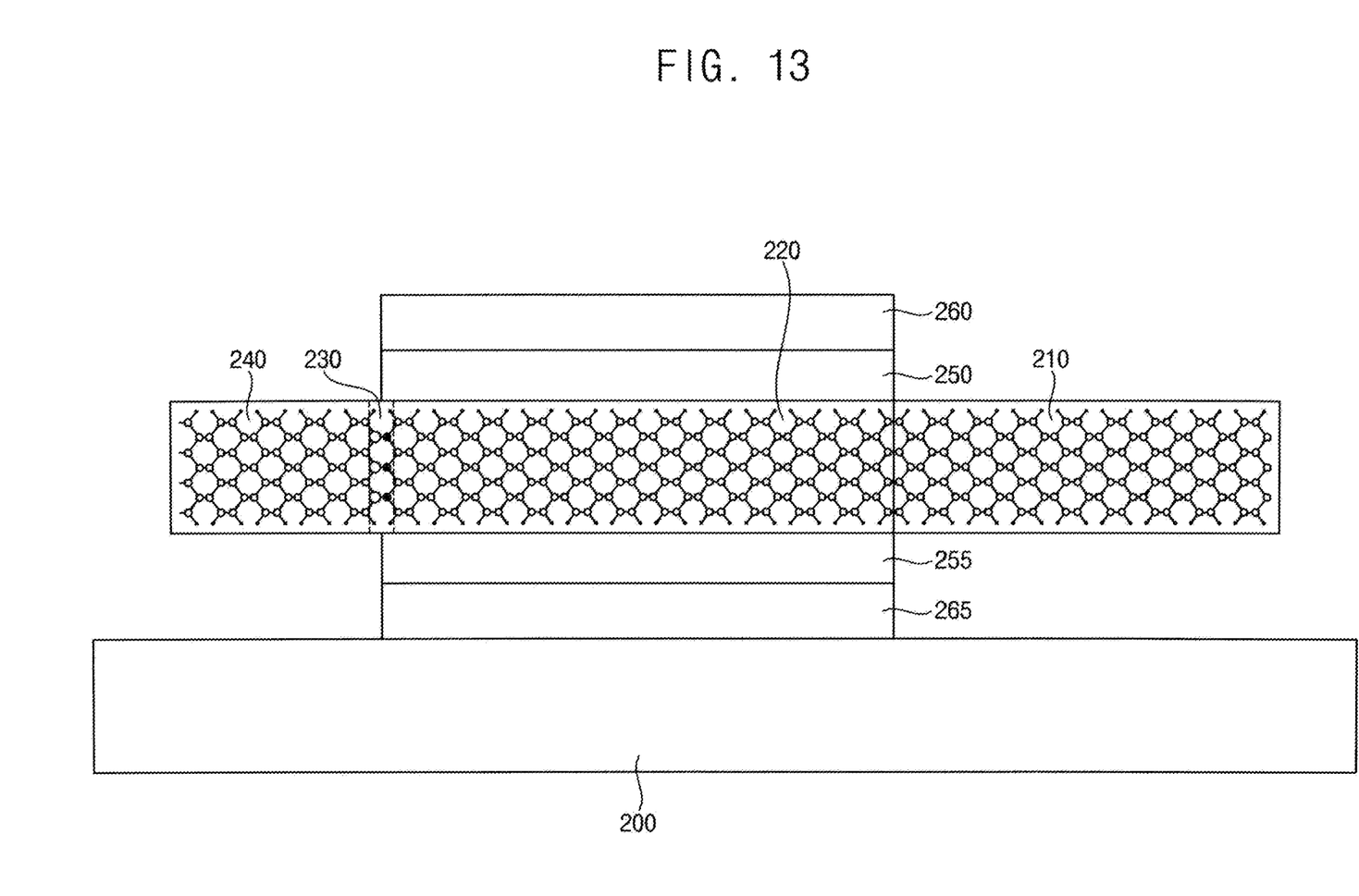
FIG. 13 is a cross-sectional view illustrating a TFET in accordance with example embodiments.
Figure 14:
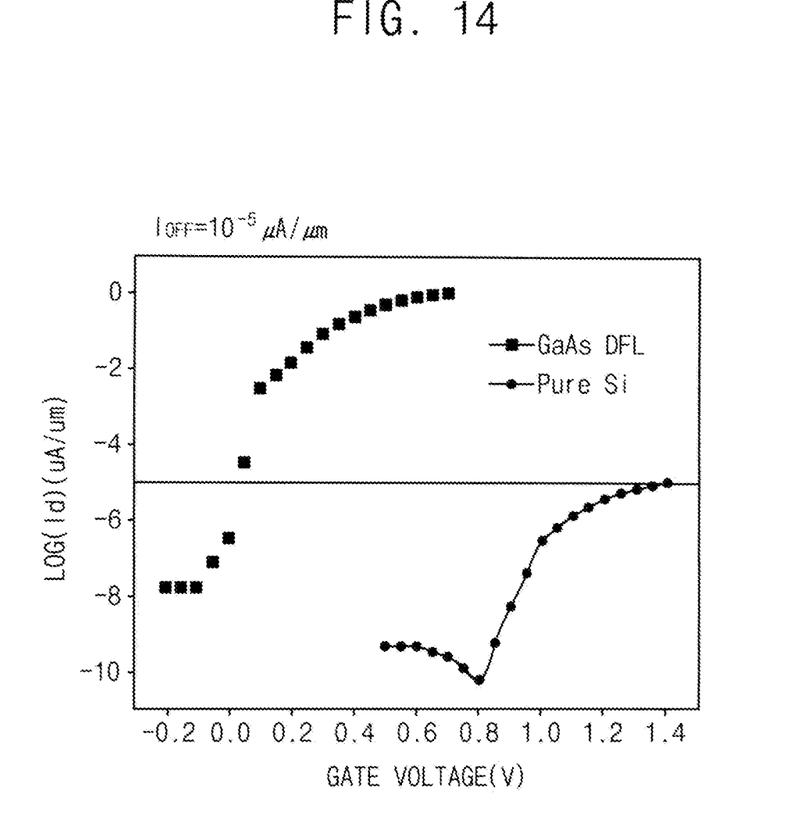
FIG. 14 is a graph illustrating the difference between electrical characteristics of the TFET and those of the conventional homo-junction TFET.

FIG. 13 is a cross-sectional view illustrating a TFET in accordance with example embodiments, and FIG. 14 is a graph illustrating the difference between electrical characteristics of the TFET and those of the conventional homojunction TFET.

Referring to FIG. 13, the TFET may include a drain region 210, a channel 220, a DFL layer 230 and a source region 240 sequentially arranged in a horizontal direction substantially parallel to an upper surface of the substrate 200, and may further include first and second gate insulation patterns 250 and 255 on and beneath the channel 220, respectively, and first and second gate electrodes 260 and 265 on and beneath the first and second gate insulation patterns 250 and 255, respectively. Thus, the TFET may be a double gate TFET.

The TFET may further include a source contact plug electrically connected to the source region 240 and a drain contact plug electrically connected to the drain region 210.

The TFET may be substantially the same as or similar to that of FIGS. 10 to 12, except that the channel 220 is not a vertical channel but a horizontal channel, and thus repeated explanations thereon are omitted herein.

However, a contact surface of the channel 220 or the source region 240 that may contact the DFL 230 may have (001) crystal plane, (111) crystal plane or (311) crystal plane. That is, in the TFET shown in FIG. 13, the DFL 230 and the channel 220, and the DFL 230 and the source region 240 may be arranged in the horizontal direction, so that a side surface of the channel 220 and a side surface of the source region 240 contacting the DFL 230 may have (001) crystal plane, (111) crystal plane or (311) crystal plane.

The TFET may not be necessarily a double gate TFET, and for example, the TFET may be a single gate TFET including one of the first and second gate electrodes 260 and 265 and one of the first and second gate insulation patterns 250 and 255.

Referring to FIG. 14, electrical characteristics of the double gate TFET in accordance with example embodiments shown in FIG. 13 and a TFET including no DFL, that is, a homo-junction TFET may be compared through simulation.

In the simulation, a horizontal length of the drain region 210 was 20 nm, a horizontal length of the source region 240 was 10 nm, a horizontal length of each of the first and second gate electrodes 260 and 265 was 10 nm, a vertical thickness of the channel was 1.6 nm, and a thickness of each of the first and second gate insulation patterns 250 and 255 was 1.0 nm. The drain region 210 was doped with n-type impurities of $2.0*10^{19}$, the source region 240 was doped with p-type impurities of $1.0*10^{20}$, a source-drain voltage was 0.5V, and an off-current was $10^{-5}$ µA/µm.

As a result of the simulation, the TFET in accordance with example embodiments has an on-current $I_{on}$ of about $10^5$ times an on-current $I_{off}$ of a homo-junction TFET, and thus may have a high on-off ratio that is a ratio of an on-current $I_{on}$ with respect to an off-current $I_{off}$. Additionally, a slope of a SS of the TFET in accordance with example embodiments is greater than that of a SS of the homo-junction TFET, so as to have a relatively low value. Accordingly, the TFET may be operated with a relatively low threshold voltage or a relatively low operation voltage.

The inventive concepts may be applied to various transistors requiring a low power consumption, e.g., single gate transistors, double gate transistors, vertical channel transistors, finFETs, nanowire transistors, gate all around transistors, etc.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A tunneling field effect transistor (TFET), comprising:
   a drain region on a substrate;
   a channel on the drain region;
   a dipole formation layer (DFL) on the channel;
   a source region on the DFL;
   a gate insulation pattern surrounding the channel; and
   a gate electrode surrounding the gate insulation pattern,
   wherein the DFL contacts the channel and the source region and forms dipoles between the channel and the source region.

2. The TFET of claim 1, wherein the DFL includes a III-V group compound or a II-VI group compound.

3. The TFET of claim 2, wherein the DFL includes gallium arsenide (GaAs), indium arsenide (InAs), gallium antimonide (GaSb) or indium antimonide (InSb).

4. The TFET of claim 2, wherein the DFL includes a bilayer or a plurality of bilayers, the bilayer including a III group material layer and a V group material layer, or a II group material layer and a VI group material layer.

5. The TFET of claim 1, wherein the channel, the drain region and the source region include a IV group material, and
   wherein the drain region and the source region are doped with n-type impurities and p-type impurities, respectively.

6. The TFET of claim 5, wherein the channel is undoped, or doped with n-type impurities with a doping concentration less than that of the drain region.

7. The TFET of claim 5, wherein the channel includes silicon, and
   wherein an upper surface of the channel contacting the DFL has (001) crystal plane, (111) crystal plane, or (311) crystal plane.

8. The TFET of claim 1, wherein the DFL at least partially overlaps the gate electrode in a horizontal direction substantially parallel to an upper surface of the substrate.

9. The TFET of claim 8, wherein a portion of the DFL overlapped by the gate electrode is covered by the gate insulation pattern.

10. A tunneling field effect transistor (TFET), comprising:
    a source region on a substrate, the source region including a IV group material doped with p-type impurities;
    a drain region on the substrate, the drain region being spaced apart from the source region in a horizontal direction substantially parallel to an upper surface of the substrate and including the IV group material doped with n-type impurities;
    a channel between the source region and the drain region, the channel including the IV group material;
    a DFL between and contacting the source region and the channel, the DFL including a III-V group compound or a II-VI group compound; and
    a gate electrode overlapping the channel and at least a portion of the DFL in a vertical direction substantially perpendicular to the upper surface of the substrate,
    wherein the DFL forms dipoles between the channel and the source region.

11. The TFET of claim 10, wherein the DFL includes gallium arsenide (GaAs), indium arsenide (InAs), gallium antimonide (GaSb) or indium antimonide (InSb).

12. The TFET of claim 11, wherein the DFL includes a bilayer or a plurality of bilayers, the bilayer including a III group material layer and a V group material layer, or a II group material layer and a VI group material layer.

13. The TFET of claim 10, wherein the channel is undoped, or doped with n-type impurities at a doping concentration less than that of the drain region.

14. The TFET of claim 10, wherein the channel includes silicon, and
    wherein an upper surface of the channel contacting the DFL has (001) crystal plane, (111) crystal plane, or (311) crystal plane.

15. The TFET of claim 10, further comprising a gate insulation pattern between the channel and the gate electrode.

16. The TFET of claim 15, wherein a portion of the DFL overlapped by the gate electrode is covered by the gate insulation pattern.

17. The TFET of claim 10, wherein the gate electrode is disposed on the channel.

18. The TFET of claim 17, wherein the gate electrode is a first gate electrode, and
    wherein the TFET further comprises a second gate electrode under the channel.

19. A semiconductor device, comprising:
    a drain region on a substrate, the drain region including silicon doped with n-type impurities;
    a channel on the drain region, the channel including undoped silicon or silicon doped with n-type impurities with a doping concentration less than that of the drain region;
    a DFL on the channel, the DFL including a III-V group compound or a II-VI group compound;
    a source region on the DFL, the source region including silicon doped with p-type impurities;
    a gate insulation pattern surrounding the channel;
    a gate electrode surrounding the gate insulation pattern;
    a first contact plug electrically connected to the source region; and a second contact plug electrically connected to the drain region,
wherein the DFL contacts the channel and the source region and forms dipoles between the channel and the source region.

20. The semiconductor device of claim 19, wherein a lower surface of the DFL is lower than an upper surface of the gate electrode.

* * * * *